US008591795B2

(12) United States Patent
Mazumder et al.

(10) Patent No.: US 8,591,795 B2
(45) Date of Patent: Nov. 26, 2013

(54) METHOD OF EXOCASTING AN ARTICLE OF SEMICONDUCTING MATERIAL

(75) Inventors: Prantik Mazumder, Ithaca, NY (US); Balram Suman, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 684 days.

(21) Appl. No.: 12/631,054

(22) Filed: Dec. 4, 2009

(65) Prior Publication Data
US 2011/0135902 A1 Jun. 9, 2011

(51) Int. Cl.
*C30B 28/04* (2006.01)

(52) U.S. Cl.
USPC ........... 264/306; 264/301; 264/327; 264/332; 428/446; 117/73; 117/74

(58) Field of Classification Search
None
See application file for complete search history.

(56) References Cited

U.S. PATENT DOCUMENTS

| | | | | |
|---|---|---|---|---|
| 3,948,650 A | | 4/1976 | Flemings et al. | 75/135 |
| 4,112,135 A | * | 9/1978 | Heaps et al. | 438/479 |
| 4,128,680 A | | 12/1978 | Heaps et al. | 428/137 |
| 4,137,355 A | | 1/1979 | Heaps et al. | 428/201 |
| 4,243,472 A | | 1/1981 | O'Neill | 156/624 |
| 4,251,570 A | | 2/1981 | Zook | 427/74 |
| 4,447,280 A | * | 5/1984 | Malthouse | 156/85 |
| 4,447,289 A | | 5/1984 | Geissler et al. | 156/608 |
| 4,778,478 A | | 10/1988 | Barnett | 437/5 |
| 5,380,372 A | * | 1/1995 | Campe et al. | 136/258 |
| 5,712,199 A | | 1/1998 | Nakagawa et al. | 438/62 |
| 6,231,667 B1 | | 5/2001 | Iwane et al. | 117/55 |
| 6,413,313 B1 | * | 7/2002 | Yoshida et al. | 117/200 |
| 6,581,415 B2 | | 6/2003 | Chandra et al. | 65/66 |
| 6,596,075 B2 | * | 7/2003 | Igarashi et al. | 117/26 |
| 6,682,990 B1 | | 1/2004 | Iwane et al. | 438/458 |
| 6,746,225 B1 | | 6/2004 | McHugh | 425/130 |
| 6,802,900 B2 | | 10/2004 | Iwane et al. | 117/54 |
| 6,946,029 B2 | | 9/2005 | Tsukuda et al. | 117/16 |

(Continued)

FOREIGN PATENT DOCUMENTS

| | | |
|---|---|---|
| EP | 1085559 A2 | 3/2001 |
| JP | 60-213351 A | 10/1985 |

(Continued)

OTHER PUBLICATIONS

Mazumder, P., and Trivedi, R., "Novel pattern forming process due to coupling of convection and phase change", Phys. Rev. Lett., vol. 88, 2002, pp. 235507.

(Continued)

*Primary Examiner* — Benjamin Schiffman
(74) *Attorney, Agent, or Firm* — Michael W. Russell

(57) ABSTRACT

A method of making an article of a semiconducting material involves selecting a target thickness for the article and then submerging a mold into a molten semiconducting material for a submersion time effective to form a solid layer of semiconducting material over an external surface of the mold where the thickness of the solid layer is substantially equal to the target thickness. The submersion time is selected to be substantially equal to a transition time, which is determined from a plot of solid layer thickness versus submersion time for a mold having particular attributes, including mold composition, mold thickness and initial mold temperature. The transition time, and thus the submersion time, corresponds to a maximum in solid layer thickness in the solid layer thickness versus submersion time curve for the particular mold.

9 Claims, 17 Drawing Sheets

(56) References Cited

U.S. PATENT DOCUMENTS

| | | | |
|---|---|---|---|
| 7,071,489 B2 | 7/2006 | Tsukuda | 257/75 |
| 7,111,476 B2 | 9/2006 | Loxley et al. | 65/17.2 |
| 7,186,578 B2 | 3/2007 | Goma et al. | 438/22 |
| 7,294,197 B1 | 11/2007 | Gralenski | 117/37 |
| 7,771,643 B1* | 8/2010 | Cook et al. | 264/305 |
| 2001/0044163 A1* | 11/2001 | Tsukuda et al. | 438/22 |
| 2002/0092464 A1* | 7/2002 | Nakagawa et al. | 117/94 |
| 2003/0140859 A1* | 7/2003 | Ukiyo et al. | 118/726 |
| 2005/0239225 A1* | 10/2005 | Goma et al. | 438/22 |
| 2006/0160336 A1* | 7/2006 | Mizutani et al. | 438/488 |
| 2009/0004835 A1* | 1/2009 | Drevet et al. | 438/486 |
| 2009/0044925 A1* | 2/2009 | Schonecker et al. | 164/77 |
| 2009/0297395 A1* | 12/2009 | Mazumder et al. | 420/556 |
| 2010/0219549 A1* | 9/2010 | Cook et al. | 264/85 |
| 2010/0290946 A1* | 11/2010 | Cook et al. | 420/555 |
| 2010/0291380 A1* | 11/2010 | Mazumder et al. | 428/338 |
| 2010/0295061 A1* | 11/2010 | Sachs et al. | 257/77 |
| 2011/0033643 A1* | 2/2011 | Cook et al. | 428/34.6 |
| 2011/0101281 A1* | 5/2011 | Cook et al. | 252/500 |
| 2011/0135902 A1* | 6/2011 | Mazumder et al. | 428/220 |
| 2012/0027996 A1* | 2/2012 | Cook et al. | 428/156 |

FOREIGN PATENT DOCUMENTS

| | | |
|---|---|---|
| WO | WO 2005/104244 A1 | 11/2005 |
| WO | WO 2009/002550 A1 | 12/2008 |
| WO | WO 2009/108358 A1 | 9/2009 |

OTHER PUBLICATIONS

Ciszek, T.F., "Review Paper: Techniques for the Crystal Growth of Silicon Ingots and Ribbons," Journal of Crystal Growth, vol. 66, 1984, pp. 655-672.

Yeckel, A., Salinger, A.G., and Derby, J.J., "Theoretical analysis and design considerations for float-zone refinement of electronic grade silicon sheets," Journal of Crystal Growth, vol. 152, 1995, pp. 51-64.

Kalejs, J. P., "Silicon ribbons and foils state of the art," Solar Energy Materials & Solar Cells, vol. 72, 2002, pp. 139-153.

Hanoka, J. I., "An overview of silicon ribbon growth technology," Solar Energy Materials & Solar Cells, vol. 65, 2001, pp. 231-237.

Tomoyuki, Takakura et al., "Effect of Rapid Thermal Process for CDS Silicon Solar Cell," poster, Sharp, Japan.

Mitsuyasu, Hidemi et al., "Characteristics of CDS Silicon Wafers," poster, Sharp, Japan.

Li, J.G. and Hausner, H., "Wetting and adhesion in liquid silicon/ceramic systems," Materials Letters, 14 (1992), pp. 329-332.

Turnbull, D., "Formation of Crystal Nuclei in Liquid Metals," Journal of Applied Physics, 21 (Oct. 1950), pp. 1022-1028.

Turnbull, D., "Kinetics of Heterogeneous Nucleation," Journal of Chemical Physics, vol. 18, No. 2 (Feb. 1950), pp. 198-203.

Turnbull, D. and Fischer, J.C., "Rate of Nucleation in Condensed Systems," Journal of Chemical Physics, vol. 17, No. 1 (Jan. 1949), pp. 71-73.

Bell, R. O., and Kalejs, J. P., "Growth of silicon sheets for photovoltaic applications," *Journal of Materials Research*, pp. 2732-2739, vol. 13, No. 10, Oct. 1998.

* cited by examiner

METHOD OF EXOCASTING AN ARTICLE OF SEMICONDUCTING MATERIAL

FIELD

The disclosure relates to methods of making an article of semiconducting material, and more particularly to exocasting methods whereby an article of semiconducting material is formed over an external surface of a mold.

BACKGROUND

Semiconducting materials are used in a variety of applications, and may be incorporated, for example, into electronic devices such as photovoltaic devices. Photovoltaic devices convert light radiation into electrical energy through the photovoltaic effect.

The properties of semiconducting materials may depend on a variety of factors, including crystal structure, the concentration and type of intrinsic defects, and the presence and distribution of dopants and other impurities. Within a semiconducting material, the grain size and grain size distribution, for example, can impact the performance of resulting devices. By way of example, the electrical conductivity and thus the overall efficiency of a semiconductor-based device such as a photovoltaic cell will generally improve with larger and more uniform grains.

For silicon-based devices, silicon may be formed using a variety of techniques. Examples include silicon formed as an ingot, sheet or ribbon. The silicon may be supported or unsupported by an underlying substrate. However, such conventional methods for making supported and unsupported articles of silicon have a number of shortcomings.

Methods of making unsupported thin semiconducting material sheets, including silicon sheets, may be slow or wasteful of the semiconducting material feedstock. Unsupported single crystalline semiconducting materials can be produced, for example, using the Czochralski process. However, such bulk methods may disadvantageously result in significant kerf loss when the material is cut into thin sheets or wafers. Additional methods by which unsupported polycrystalline semiconducting materials can be produced include electromagnetic casting and ribbon growth techniques. However, these techniques tend to be slow and expensive. Polycrystalline silicon ribbon produced using silicon ribbon growth technologies is typically formed at a rate of only about 1-2 cm/min.

Supported semiconducting material sheets may be produced less expensively, but the semiconducting material sheet may be limited by the substrate on which it is formed, and the substrate may have to meet various process and application requirements, which may be conflicting.

Useful methods for producing unsupported polycrystalline semiconducting materials are disclosed in commonly-owned U.S. Provisional Patent Application No. 61/067,679, filed Feb. 29, 2008, titled "Method of Making an Unsupported Article of a Pure or Doped Semiconducting Element or Alloy," and U.S. Patent Application No. PCT/US09/01268, filed Feb. 27, 2009, titled "Methods of Making an Unsupported Article of Pure of Doped Semiconducting Element or Alloy," the disclosures of which are hereby incorporated by reference.

As described herein, the inventors have now discovered additional methods by which supported and unsupported articles of semiconducting materials may be made. The disclosed methods may facilitate formation of exocast semiconducting materials having desirable attributes such as improved crystal grain structure, reduced concentrations of impurities and/or defects, low surface roughness, and uniform thickness while reducing material waste and increasing the rate of production.

SUMMARY

In accordance with various exemplary embodiments, an exocasting method of making a solid layer of a semiconducting material comprises selecting a mold having at least one mold attribute such that in a plot of solid layer thickness versus submersion time for submersion of the mold into molten semiconducting material, a maximum in the solid layer thickness, which occurs at a transition time, is substantially equal to a target thickness for the solid layer. As used herein, the term "substantially equal" refers to values that are equivalent or which differ by 20% or less (e.g., 5% or less). The mold is then submerged into and withdrawn from the molten semiconducting material to form a solid layer of semiconducting material over an external surface of the mold, wherein a submersion time for the mold is substantially equal to the transition time.

As used herein, the term "semiconducting material" includes materials that may exhibit semiconducting properties, such as, for example, silicon, alloys and compounds of silicon, germanium, alloys and compounds of germanium, gallium arsenide, alloys and compounds of gallium arsenide, alloys and compounds of tin, and combinations thereof. In various embodiments, the semiconducting material may be pure (such as, for example, intrinsic or i-type silicon) or doped (such as, for example, silicon containing at least one n-type or p-type dopant, such as phosphorous or boron, respectively).

As used herein, the phrases "article of semiconducting material," "exocast article," and variations thereof include any shape or form of semiconducting material made using the disclosed methods. Examples of such articles may be smooth, textured, flat, curved, bent, angled, dense, porous, symmetric or asymmetric. Articles of semiconducting materials may comprise forms such as, for example, sheets, wafers or tubes.

As used herein, the term "mold" means a physical structure having an external surface upon or over which the article of semiconducting material can be formed. Molten or solid semiconducting material need not physically contact an external surface of the mold, although contact may occur.

As used herein, the term "external surface of a mold" means a surface of the mold that may be exposed to molten semiconducting material upon submersion of the mold into the molten semiconducting material.

As used herein, the term "supported" means that an article of semiconducting material is integral with a mold. The supported article of semiconducting material may optionally remain on the mold for further processing.

As used herein, the term "unsupported" means that an article of semiconducting material is not integral with a mold. The unsupported article of semiconducting material may be supported by a mold while it is being formed, but is then separated from the mold.

As used herein, the phrase "form a solid layer of a semiconducting material over an external surface of a mold" and variations thereof mean that at least some of the semiconducting material from the molten semiconducting material solidifies on or over an external surface of the mold.

As used herein, the term "crystalline" means any material comprising a crystal structure, including, for example, single crystal and polycrystalline semiconducting materials.

As used herein, the term "polycrystalline" includes any material comprised of a plurality of crystal grains. For example, polycrystalline materials may include micro-crystalline and nano-crystalline materials.

As used herein, the terms, "temperature of the molten semiconducting material," "bulk temperature of the molten semiconducting material," and variations thereof mean the average temperature of the molten semiconducting material contained within a vessel. Localized temperatures within the molten semiconducting material may vary spatially at any point in time, such as, for example, in areas of the molten semiconducting material proximate to the mold while the mold is submersed, or molten semiconducting material exposed to atmospheric conditions near a top surface of the vessel. In various embodiments, the average temperature of the molten semiconducting material is substantially uniform despite any localized temperature variation.

As used herein, the term "undercooling" refers to a process by which a temperature difference is generated between the molten semiconducting material and the mold, which may cause solidification of the molten semiconducting material. The amount of undercooling may be measured in degrees Celsius (° C.) or degrees Fahrenheit (° F.).

As used herein, the term "submersion time," unless otherwise indicated, refers to the average time that a mold is submerged in molten semiconducting material. For a mold having length L, the submersion time is equal to $L/2V_{in}+L/2V_{out}+t_{dwell}$, where $V_{in}$ and $V_{out}$ are the submersion and withdrawal velocities, respectively, and $t_{dwell}$ is an optional dwell time (e.g., hold time) between submersion and withdrawal. In embodiments where the submersion velocity is equal to the withdrawal velocity and the dwell time is zero, the submersion time is simply equal to $L/V$.

Methods of affecting the thickness, thickness variability and/or morphology of a solid layer formed during an exocasting process are described herein. In the description that follows, certain aspects and embodiments will become evident. It should be understood that the invention, in its broadest sense, could be practiced without having one or more features of these aspects and embodiments. It should be understood also that these aspects and embodiments are merely exemplary and explanatory, and are not restrictive of the invention as claimed.

BRIEF DESCRIPTION OF DRAWINGS

The following Figures, which are described below and which are incorporated in and constitute a part of the specification, illustrate exemplary embodiments and are not to be considered limiting of the scope of the invention. The Figures are not necessarily to scale, and certain features and certain views of the Figures may be shown exaggerated in scale or in schematic in the interest of clarity and conciseness.

DETAILED DESCRIPTION

In an exocasting process, a solid mold is submersed into and then withdrawn from a volume of molten semiconducting material. Due in large part to heat loss to the mold and the surroundings, a portion of the molten semiconducting material undergoes a liquid-to-solid phase transformation, which results in the formation of a solid layer of the semiconducting material over an external surface of the mold. In the process, the mold acts as both a heat sink and a solid form for the solidification to occur. By controlling the submersion time, both the solid layer thickness and the variability in the solid layer thickness can be controlled.

In an embodiment, a target thickness is selected for the solid layer. A plot of solid layer thickness versus submersion time is then calculated for a mold having particular attributes, including mold composition, mold thickness and initial mold temperature, such that the calculated maximum in the solid layer thickness is substantially equal to the target thickness for the solid layer to be formed. The submersion time that corresponds to the calculated maximum solid layer thickness is defined as the transition time. The submersion time for exocasting is selected to coincide with the transition time. In this manner, the exocasting will be performed at or very near to the transition point, i.e., the point of maximum thickness where the time dependent variation in solid layer thickness is nearly zero. Thus, variations in residence time across the external surface of the mold between will not lead to large variation in solid layer thickness.

Figure 1A:
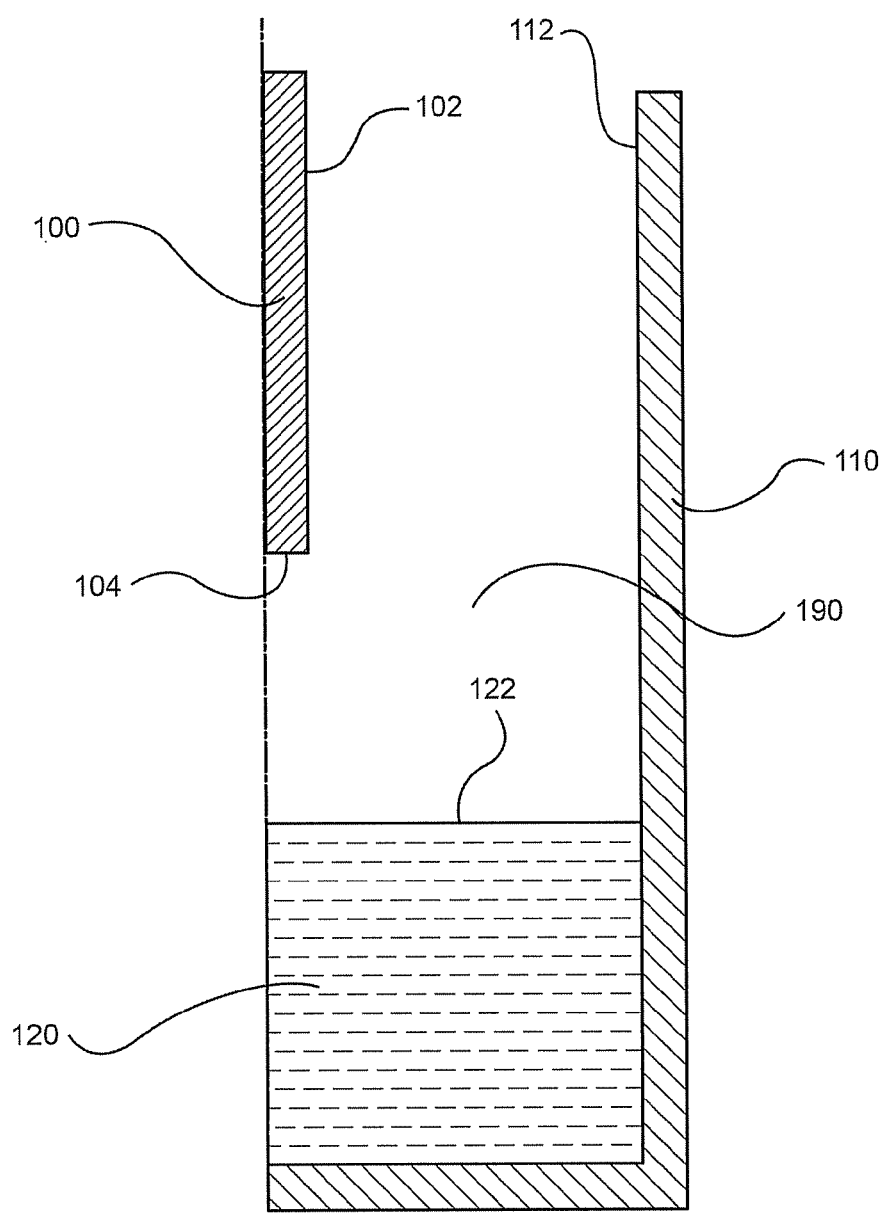
FIGS. 1A-1L illustrate an exemplary exocasting method for making an article of semiconducting material.

As shown in FIG. 1A, solid mold 100 having an external surface 102 is suspended above a vessel 110 containing a molten semiconducting material 120. Mold 100 may be in any form suitable for use in the disclosed methods. For example, mold 100 may be in the form of a monolith or wafer having a thickness ranging from 0.5 mm to 5 mm. Mold 100 may comprise a porous or a non-porous body, optionally having one or more porous or non-porous coatings. Mold 100 may comprise one or more flat external surfaces 102 or one or more curved external surfaces. A curved external surface may be convex or concave. The mold and its external surface(s) may be characterized by features including shape, dimension, surface area, surface roughness, etc. One or more of these features may be uniform or non-uniform. It will be understood that the features of the mold 100 and its external surface 102 may affect the properties of resulting exocast article.

It will be appreciated that although mold 100 and external surface 102 are illustrated in two-dimensional cross-section, mold 100 is a three-dimensional body and the solid layer 140 that forms over the external surface 102 of the mold is also a three-dimensional body having a length, a width and a thickness. As disclosed in additional detail hereinafter, the exocast solid layer 140 is formed during different stages of the exocasting process and comprises solid material formed during at least three stages of solidification.

In embodiments, mold 100 is formed from a material that is compatible with the molten semiconducting material 120. For example, the mold 100 may be formed from a material that does not melt or soften when submersed. As a further example, the mold 100 may be thermally stable and/or chemically inert to the molten semiconducting material 120, and therefore non-reactive or substantially non-reactive with the molten semiconducting material.

By way of example, the mold 100 may comprise or consist of refractory materials such as fused silica, graphite, silicon nitride, single crystal or polycrystalline silicon, as well as combinations and composites thereof. In at least one embodiment, mold 100 is made of polycrystalline silicon dioxide. The mold can have a thickness ranging from about 0.1 to 100 mm (e.g., 0.1, 0.2, 0.5, 1, 2, 5, 10, 20, 50 or 100 mm).

The molten semiconducting material 120 may be provided by melting a suitable semiconducting material in vessel 110.

Vessel 110 may be made from a material chosen from vitreous silica, graphite, and silicon nitride. The semiconducting material may be photovoltaic-grade or purer silicon. In addition to silicon, the molten semiconducting material may be chosen from alloys and compounds of silicon, alloys and compounds of tin, germanium, alloys and compounds of germanium, gallium arsenide, alloys and compounds of gallium arsenide, and combinations thereof.

The molten semiconducting material may comprise at least one non-semiconducting element that may form a semiconducting alloy or compound. For example, the molten semiconducting material may comprise gallium arsenide (GaAs), aluminum nitride (AlN) or indium phosphide (InP).

According to various embodiments, the molten semiconducting material 120 may be pure or doped. Example dopants, if present, may include boron, phosphorous, or aluminum, and may be present in any suitable concentration, e.g., 1-100 ppm, which may be chosen based on, for example, the desired dopant concentration in the resulting article of semiconducting material.

To form an article of a semiconducting material, mold 100 is at least partially submersed into molten semiconducting material 120 and then withdrawn. During the acts of submersion and withdrawal, the molten semiconducting material 102 solidifies and forms a solid layer 140 of semiconducting material over an external surface 102 of the mold.

Without wishing to be bound by theory, solidification occurs in three principal stages. The exocasting process, including a more detailed description of solidification in Stages I-III, can be understood with reference to FIGS. 1A-1L, which portray a series of sequential schematic illustrations according to various embodiments. The submersion of the mold 100 into molten semiconducting material 120 is illustrated schematically in FIGS. 1A-1F, while withdrawal of the mold 100 from the molten semiconducting material 120 is illustrated schematically in FIGS. 1G-1L.

In one exemplary embodiment, using any suitable heating device or method, mold 100 may be brought to a temperature, $T_M$, and the molten semiconducting material 120 may be brought to a bulk temperature, $T_S$, which is greater than or equal to a melting temperature of the semiconducting material.

At least one heating element (not shown) may be used to heat mold 100, vessel 110 and/or maintain the molten semiconducting material 120 at a desired temperature. Examples of suitable heating elements include resistive or inductive heating elements, infrared (IR) heat sources (e.g., IR lamps), and flame heat sources. An example of an inductive heating element is a radio frequency (RF) induction heating element. RF induction heating may provide a cleaner environment by minimizing the presence of foreign matter in the melt.

The composition of the atmosphere 190 above the molten semiconducting material 120 can be controlled before, during, and after submersion. It is believed that the use of vitreous silica for the mold 100 and/or vessel 110 may lead to oxygen contamination of the article of semiconducting material. Thus, in various embodiments, oxygen contamination may optionally be mitigated or substantially mitigated, by melting the semiconducting material and forming the article in a low-oxygen environment, comprising, for example a dry mixture of hydrogen (e.g., less than 1 ppm water) and an inert gas such as argon, krypton or xenon. A low-oxygen environment may include one or more of hydrogen, helium, argon, or nitrogen. In at least one exemplary embodiment, the atmosphere may be chosen from an Ar/1.0 wt % $H_2$ mixture or an Ar/2.5 wt % $H_2$ mixture.

Prior to submersion (FIG. 1A) the temperature of the mold $T_M$ and the temperature of the molten semiconducting material $T_S$ each can be controlled such that $T_M < T_S$. In embodiments where the molten semiconducting material comprises silicon, the bulk temperature of the molten silicon, $T_S$, may range from 1414° C. to 1550° C., such as, for example, from 1450° C. to 1490° C., e.g., 1460° C. The initial temperature of the mold, $T_M$, may range from −50° C. to 1400° C. (e.g., from −35° C. to 0° C., 20° C. to 30° C., 300° C. to 500° C.) prior to submersion in the molten semiconducting material 120. In addition to controlling the mold and molten semiconducting material temperatures, the temperature of the radiant environment, $T_E$, such as a wall 112 of the vessel 110, may also be controlled.

Figure 1B:
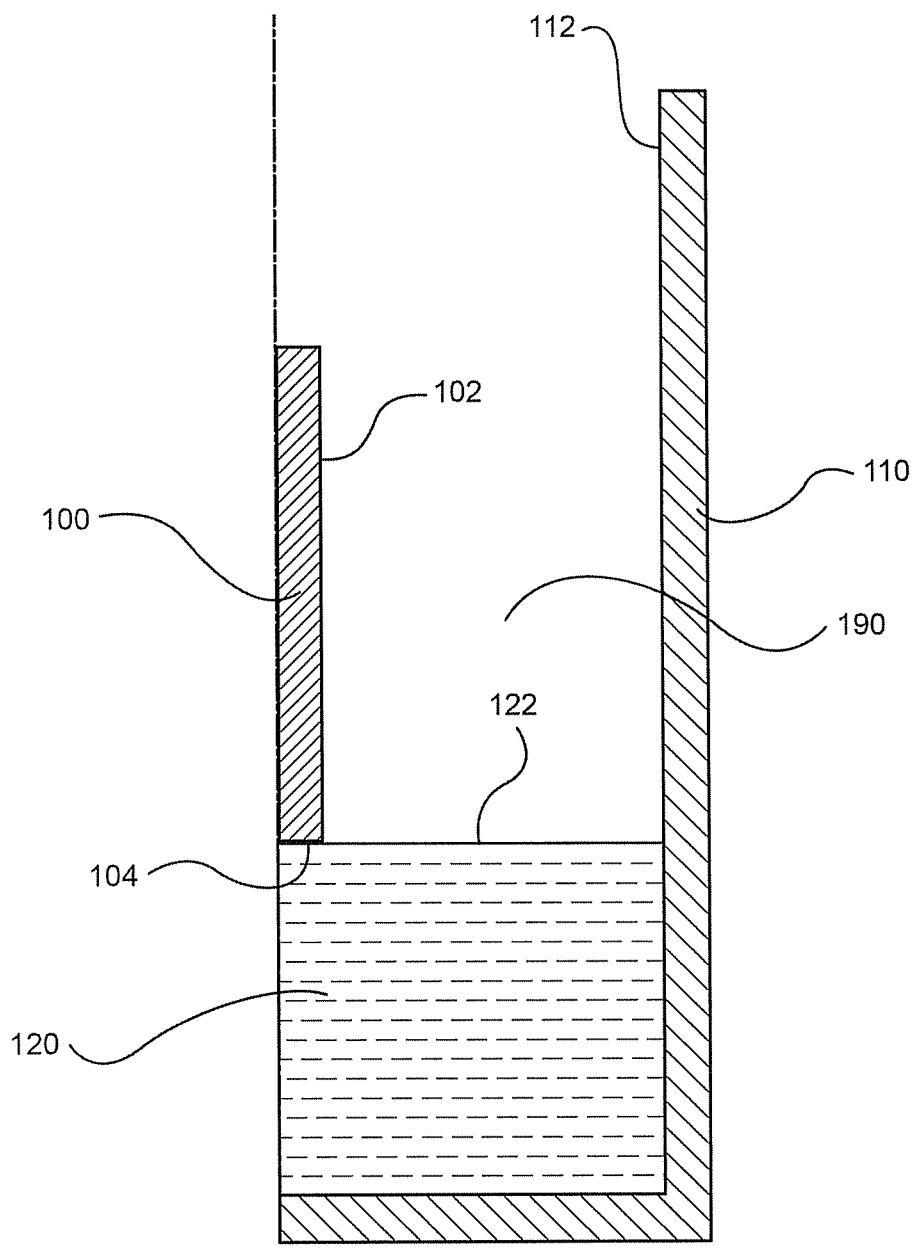
Figure 1C:
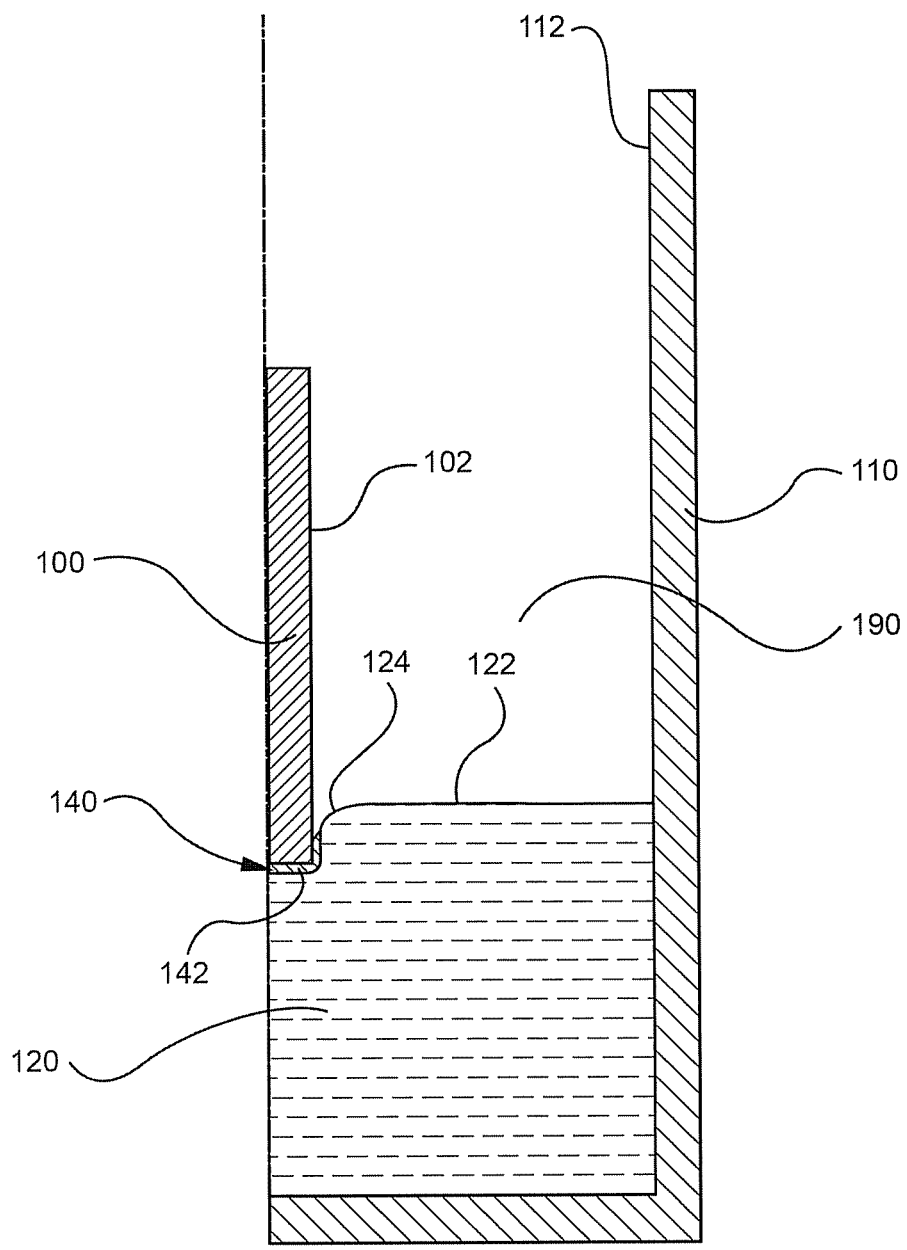

Referring to FIGS. 1B and 1C, as the mold 100 is brought closer to and then submersed into the molten semiconducting material 120, a temperature of the mold, e.g., a temperature of the mold 100 at leading edge 104, will increase due initially to radiative and then conductive and convective heat transfer from the molten semiconducting material 102 to the mold 100.

In embodiments where the mold 100 comprises silica and the molten semiconducting material 120 comprises silicon, a convex meniscus 124 will form at the point of entry of the mold into the molten silicon because silicon does not readily wet to the mold's silica surface.

Initially, the temperature of the mold 100 will remain less than the temperature of the molten semiconducting material 120. As the mold is submersed further into the molten semiconducting material (FIGS. 1D and 1E), a relatively large temperature difference between the mold 100 and the molten semiconducting material 120 will induce a liquid-to-solid phase transformation that results in the formation of a solid layer 140 of the semiconducting material over the external surface 102 of the mold.

The magnitude of the temperature difference between the mold 100 and the molten semiconducting material 120 can affect the microstructure and other properties of the solid layer 140. The combination of a relatively large temperature gradient between the mold 100 and the molten semiconducting material 120, which may be on the order of 800° C., results in the formation of a Stage I solid layer 142 over the external surface of the mold. The Stage I solid layer may comprise a relatively fine grain size.

Figure 1D:
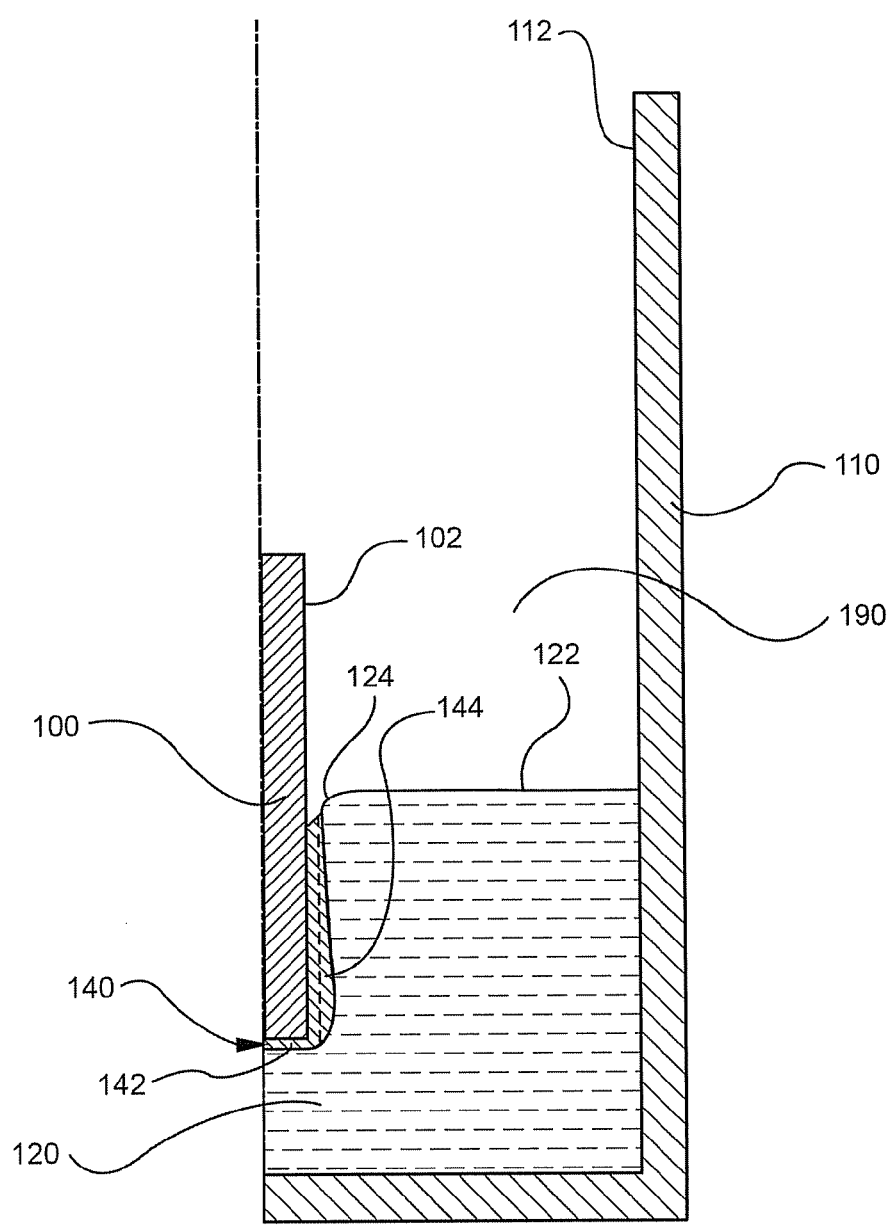
Figure 1E:
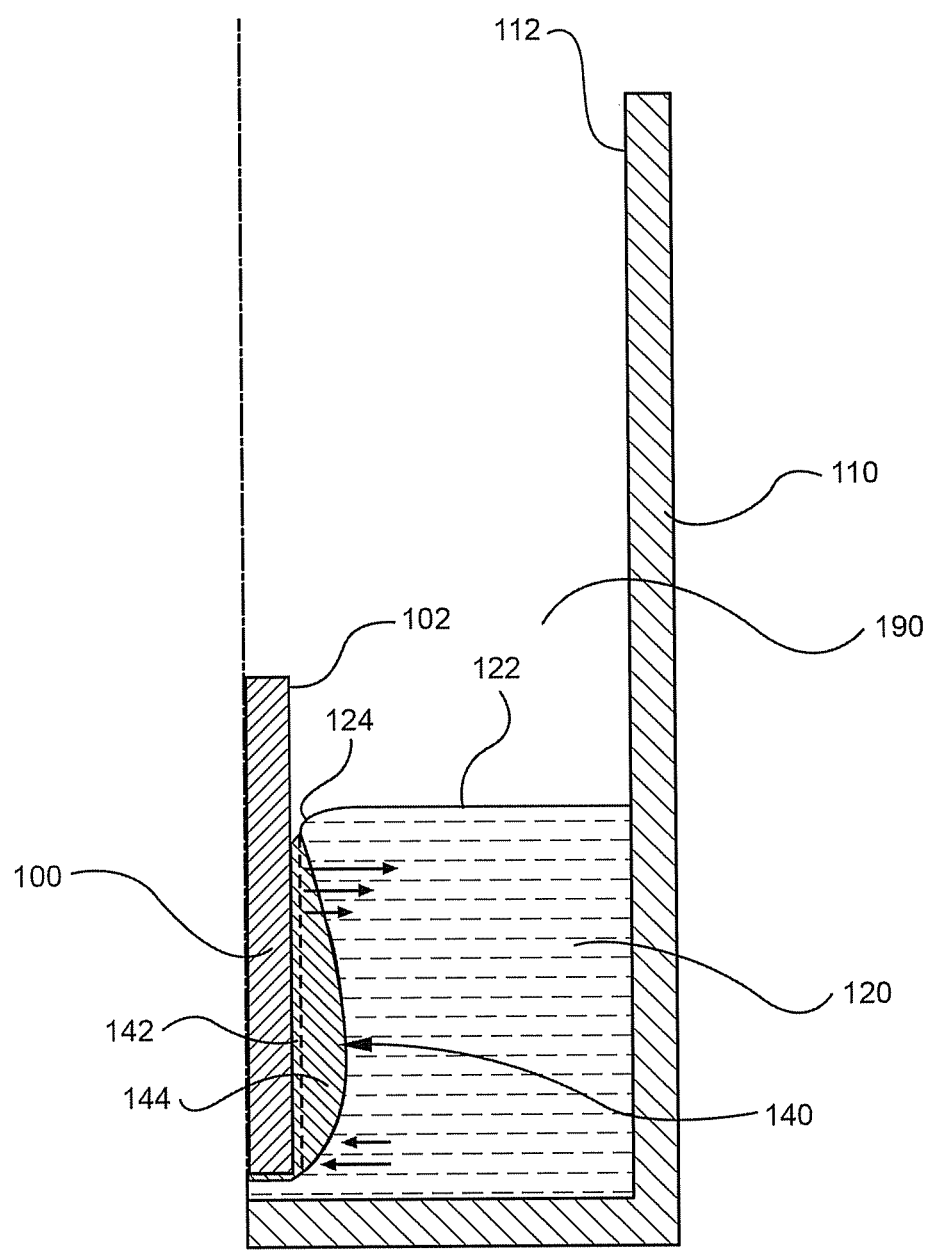

As shown in FIGS. 1C-1E, as the mold 100 is submersed, molten semiconducting material 120 is first solidified at the leading edge 104 of the mold 100. As the mold is further submersed, a thin Stage I solid layer 142 forms over the exposed surface 102 of the mold. The growth front of the Stage I solid layer 142 is continuously fed during immersion by molten material from the convex meniscus 124, and the growth direction of the Stage I solid layer 142 is substantially parallel to the relative direction of motion between the mold and the melt (i.e., the growth direction of the Stage I solid layer is substantially parallel to the exposed surface 102 of the mold).

According to embodiments, mold 100 may be rotated or vibrated as it is submersed. In other embodiments, however, the mold is maintained essentially stationary in the transverse dimensions as it is lowered into and raised out of the molten semiconducting material 120.

Figure 1F:
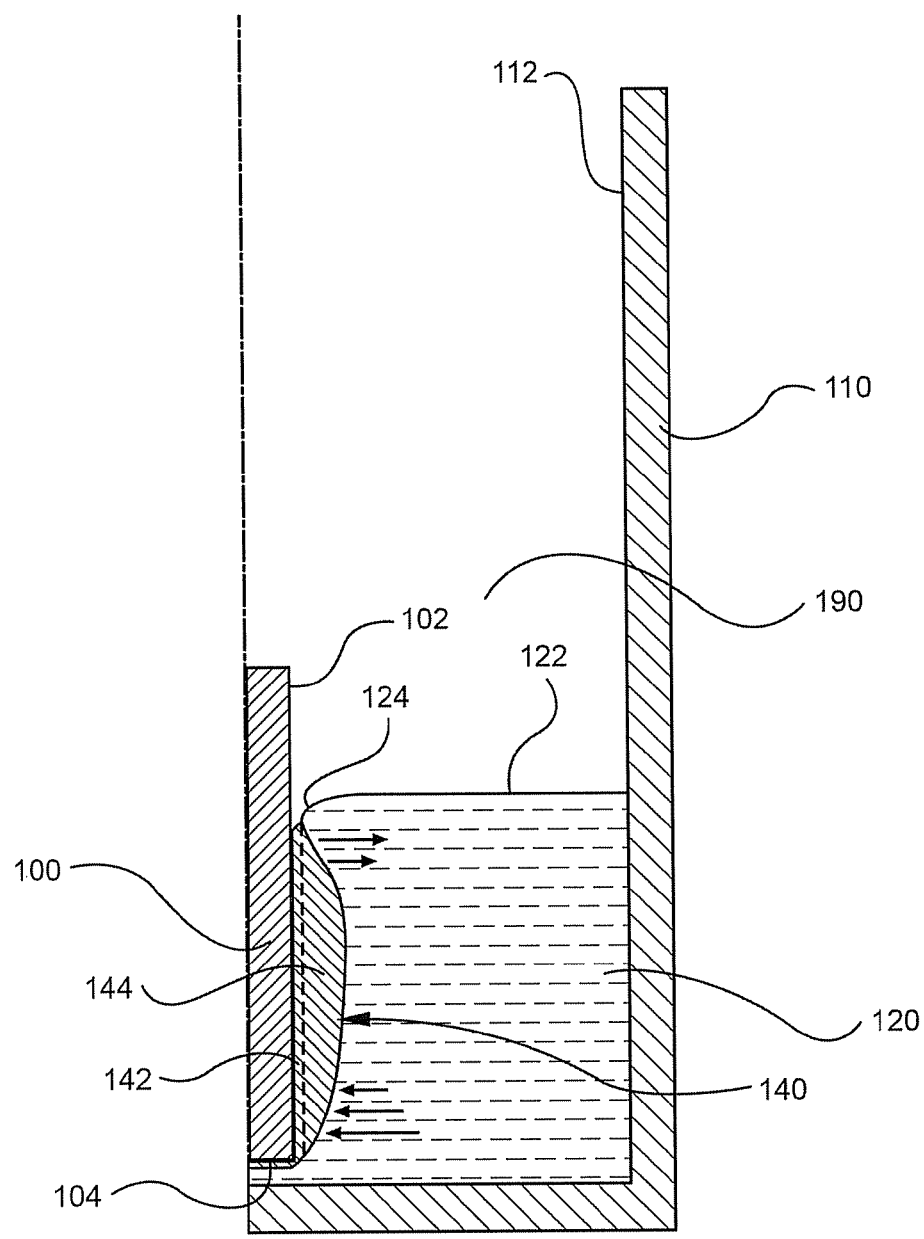

As shown in FIGS. 1D-1F, with the mold 100 at least partially submersed in the molten semiconducting material 120, the Stage I solid layer 142 (formed via a growth interface having a growth direction substantially parallel to the external surface of the mold) becomes the template for the formation of a Stage II solid layer, where molten semiconducting material 120 from the melt solidifies at the exposed surface of the Stage I solid layer. Initial formation of a Stage II solid layer 144, which typically occurs at a lower temperature differential than Stage I growth, can increase the thickness of the solid layer 140. Thus, in contrast to Stage I growth, the Stage II solid layer 144 is formed via a growth interface having a growth direction that is substantially perpendicular to the external surface of the mold. Experimental data reveal that the solid layer growth rate during Stage II growth can be on the order of 100 µm/sec.

The microstructure of the solid layer 140 (including the Stage I and Stage II solid layers), in addition to its dependence on the temperature gradient between the mold and the melt, is a function of the rate at which the relative position of the mold 100 is changed with respect to the molten semiconducting material 120. At relatively slow submersion velocities (e.g., on the order of about 1 cm/sec), the temperature differential between the mold 100 and the molten semiconducting material 120 is reduced due to heating of the mold, which generally results in a solid layer 140 having relatively large grains but a relatively small total thickness. On the other hand, at submersion velocities on the order of about 50 cm/sec, the relatively high velocity can disturb the shape of the convex meniscus 124, which can disrupt continuous grain growth and result in a discontinuous solid layer 140 having relatively small crystal grains. In embodiments, the submersion rate can be from about 1 to 50 cm/sec, e.g., 2, 5, 10 or 20 cm/sec.

Quiescent growth of the solid layer during Stage II is a function of the submersion time (i.e., residence time), which, due to the dynamic nature of the exocasting process, will vary spatially over the external surface of the mold 100. The leading edge of the mold will be in contact with the molten semiconducting material for a longer time than the trailing edge of the mold. This leads to an excess residence time for the leading edge equal to $L/V_{in}+L/V_{out}$, compared to the trailing edge, where L is the length of the mold and $V_{in}$ and $V_{out}$ are the submersion and withdrawal velocities. Because the leading edge 104 of the mold is the first part of the mold to be submersed, initial growth of the Stage II solid layer 144 can be fastest at or near the leading edge 104 where the temperature differential is the greatest. On the other hand, because the leading edge of the mold is the last part of the mold to be withdrawn, remelting of the Stage II solid layer 144 near the leading edge 104 can decrease the thickness of the solid layer 140 near the leading edge 104.

Mold 100 may be submersed in the molten semiconducting material 120 for a period of time sufficient to allow a solid layer 140 of the semiconducting material to solidify over a surface 102 of the mold 100. The mold 100 may be submersed in the molten semiconducting material 120 for up to 30 seconds or more (e.g., from 0.5 to 30 seconds). By way of a further example, the mold 100 may be submersed for up to 10 seconds (e.g., from 1 to 4 seconds). The submersion time may be varied appropriately based on parameters known to those of skill in the art, such as, for example, the temperatures and heat transfer properties of the system, and the desired properties of the article of semiconducting material.

Figure 2:
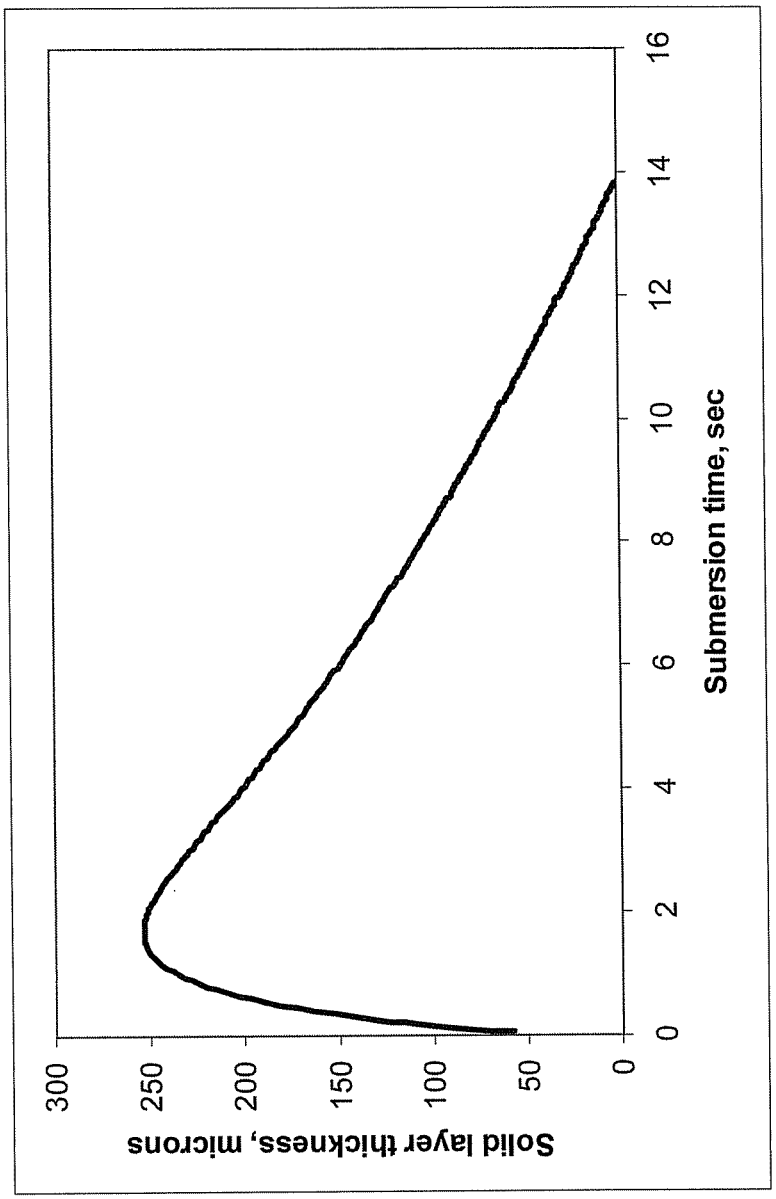
FIG. 2 is a theoretical graph of a solid layer thickness versus submersion time.

FIG. 2 shows a calculated graph of solid layer thickness measured from the external surface 102 of mold 100 as a function of submersion time. Over an initial time period, the solid layer grows rapidly to a maximum thickness. The thickness then decreases over a subsequent time period. During the initial time period, solidification of the molten semiconducting material commences at the interface between the Stage I solid layer 142 and the melt, and the Stage II layer 144 advances into the molten semiconducting material, which results in a positive rate of growth for the solid layer 140. During the subsequent time period, as the temperature of the mold increases and the heat capacity of the mold is exhausted, remelting of the Stage II solid layer 144 takes place, which results in a negative rate of growth. If the mold were left in the molten semiconducting material 120 indefinitely, eventually the entire solid layer 140 (Stage I and Stage II solid layers) would remelt and dissipate as the mold thermally equilibrates with the molten semiconducting material.

The time where the transition from solidification to remelting takes place is defined as the "transition time." The thickness of the Stage II solid layer 144 attains its maximum value at the transition time. The mold can be removed from the molten semiconducting material after a predetermined time that corresponds to the desired thickness of the solid layer.

The dynamics of both the growth and the remelting of the Stage II layer 140 can also be seen with particular reference to FIGS. 1E and 1F. In FIG. 1E, as the mold 102 is near the full extent of its immersion into the molten semiconducting material 120, the Stage II layer 144 can have a non-uniform thickness. Near the leading edge 104 of mold 100, where the average mold temperature is greatest due to its longer submersion time, the Stage II layer 144 begins to remelt as the direction of the local heat flux is outward from the mold. The remelting causes a local thinning of the Stage II layer 144 near the leading edge 104. At the other end of the mold, which has a lower average mold temperature, the direction of the local heat flux is still into the mold. Absorption of heat by the mold 102 results in growth of the Stage II layer into the melt.

Referring next to FIG. 1F, a shift in the non-uniform thickness of the Stage II layer 144 can be seen over the length of the mold as the mold temperature increases and additional remelting progresses. The small arrows in FIGS. 1E and 1F qualitatively indicate the relative solid layer growth rates at different locations along the interface between the Stage II solid layer 144 and the molten semiconducting material 120.

As illustrated in FIGS. 1A-1F, during submersion, a Stage I solid layer 142 forms over and optionally in direct contact with the exposed surface 102 of the mold 100. In turn, a Stage II solid layer 144 forms over and in direct contact with the Stage I solid layer 142. In embodiments, absent complete remelting of the solid layer 140, the thickness of the Stage I solid layer remains substantially constant during submersion and withdrawal, while the thickness of the Stage II solid layer is dynamic and a function of heat transfer dynamics. A dashed line in FIGS. 1D-1K marks the boundary between the Stage I and Stage II solid layers 142, 144.

Additional aspects of the growth and remelting of the solid layer as a function of the submersion time of the mold are described in commonly-owned U.S. patent application Ser. Nos. 12/466,104 and 12/466,143, each filed May 14, 2009, the disclosures of which being hereby incorporated by reference.

The portion of the exocasting process when the mold 100 is being submersed into the molten semiconducting material 120 is described above and is shown schematically in cross-section in FIGS. 1A-1F. In particular FIG. 1F shows the position of the mold and the formation of solid layer 140 when the mold is at its maximum extent of submersion and the velocity of the mold with respect to the molten semiconducting material 120 is zero. A further portion of the exocasting process (i.e., when the mold 100 is being withdrawn from the molten semiconducting material 120), including the formation of a Stage III solid layer 146 over a surface of the mold, is described next with particular reference to FIGS. 1G-1L.

Figure 1G:
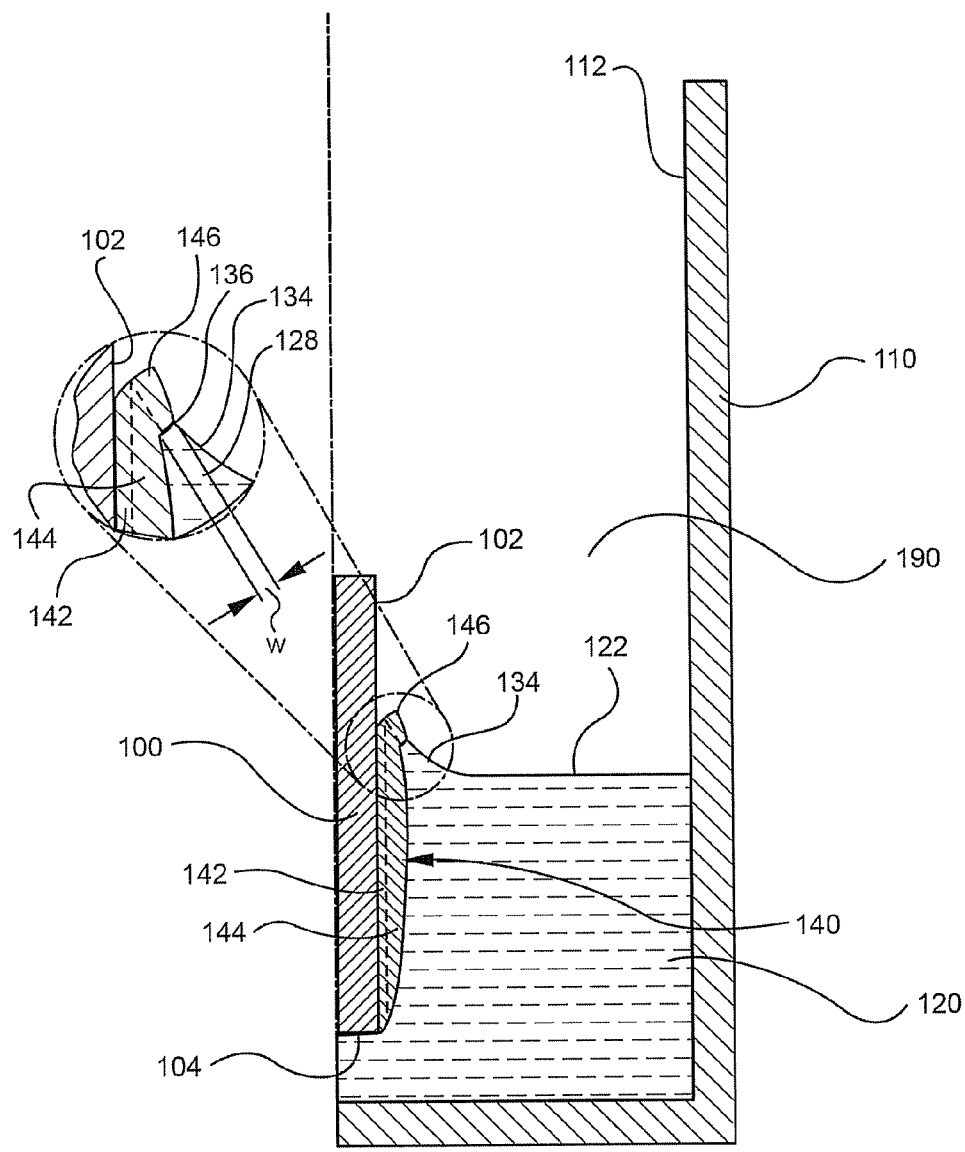
Figure 1H:
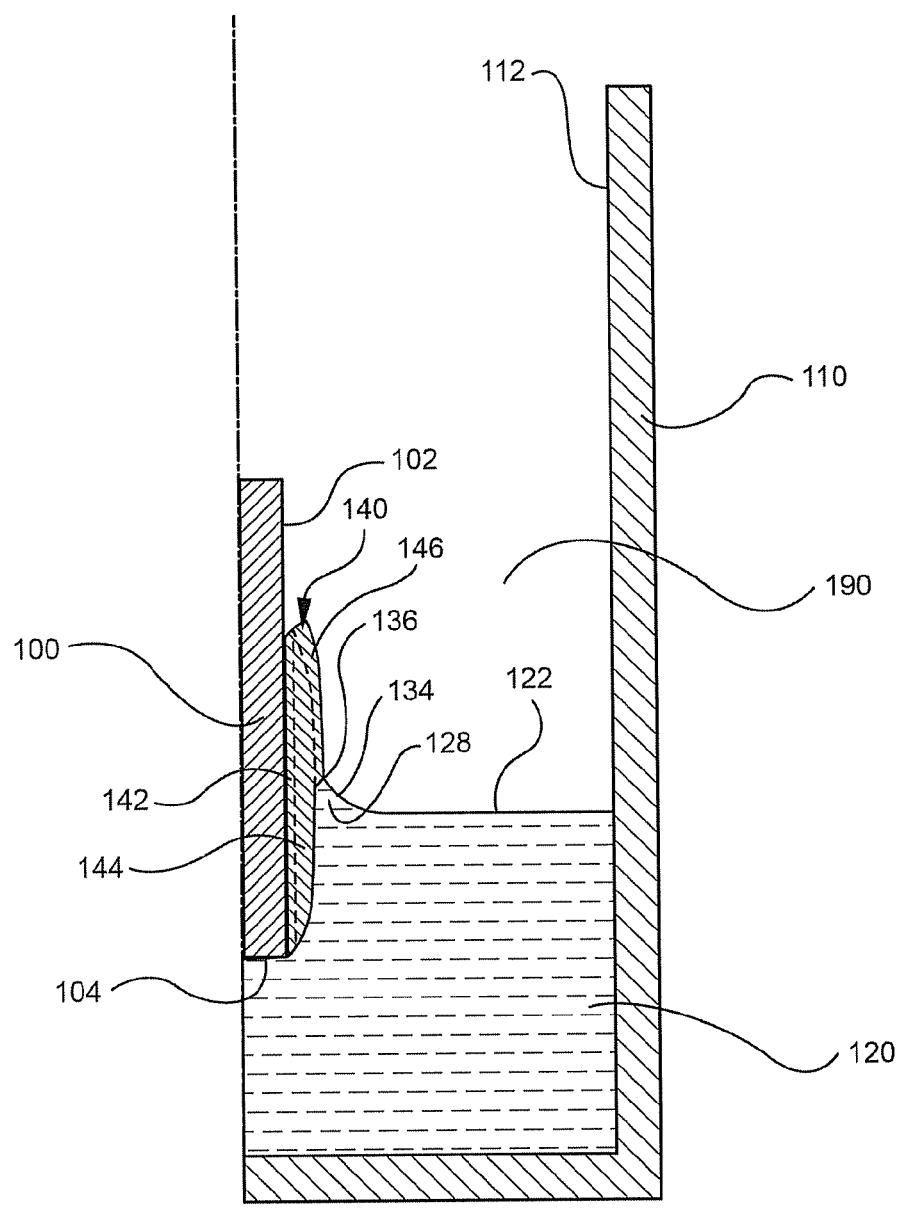
Figure 1I:
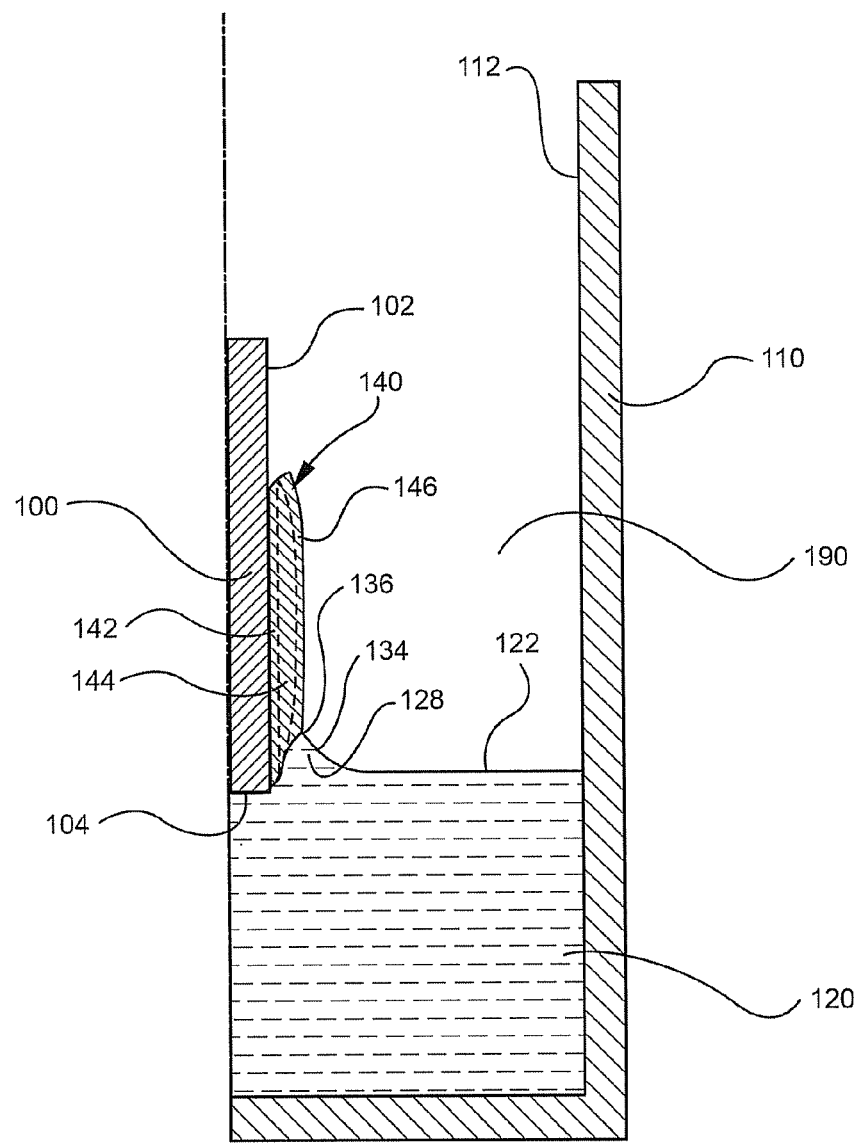
Figure 1J:
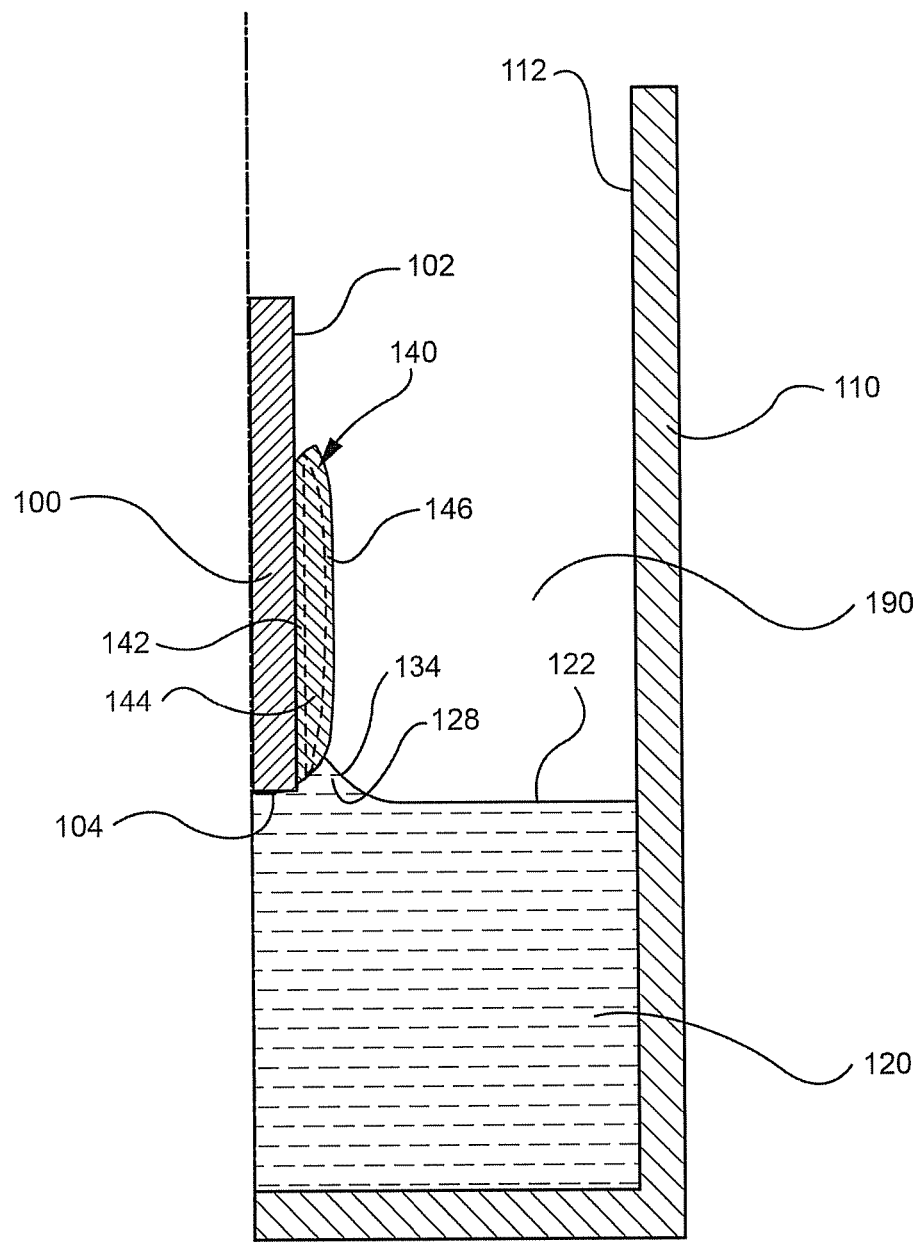
Figure 1K:
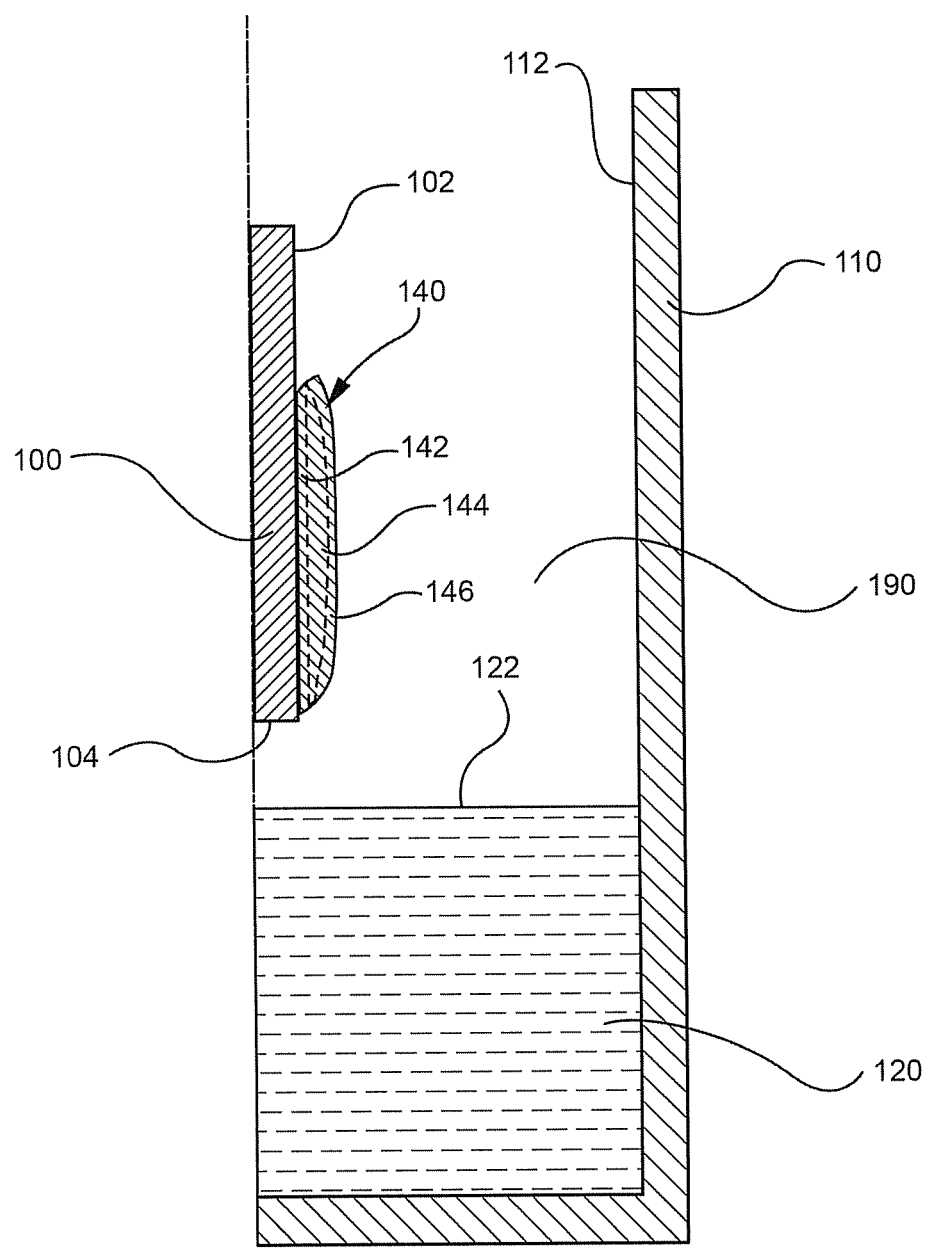
Figure 1L:
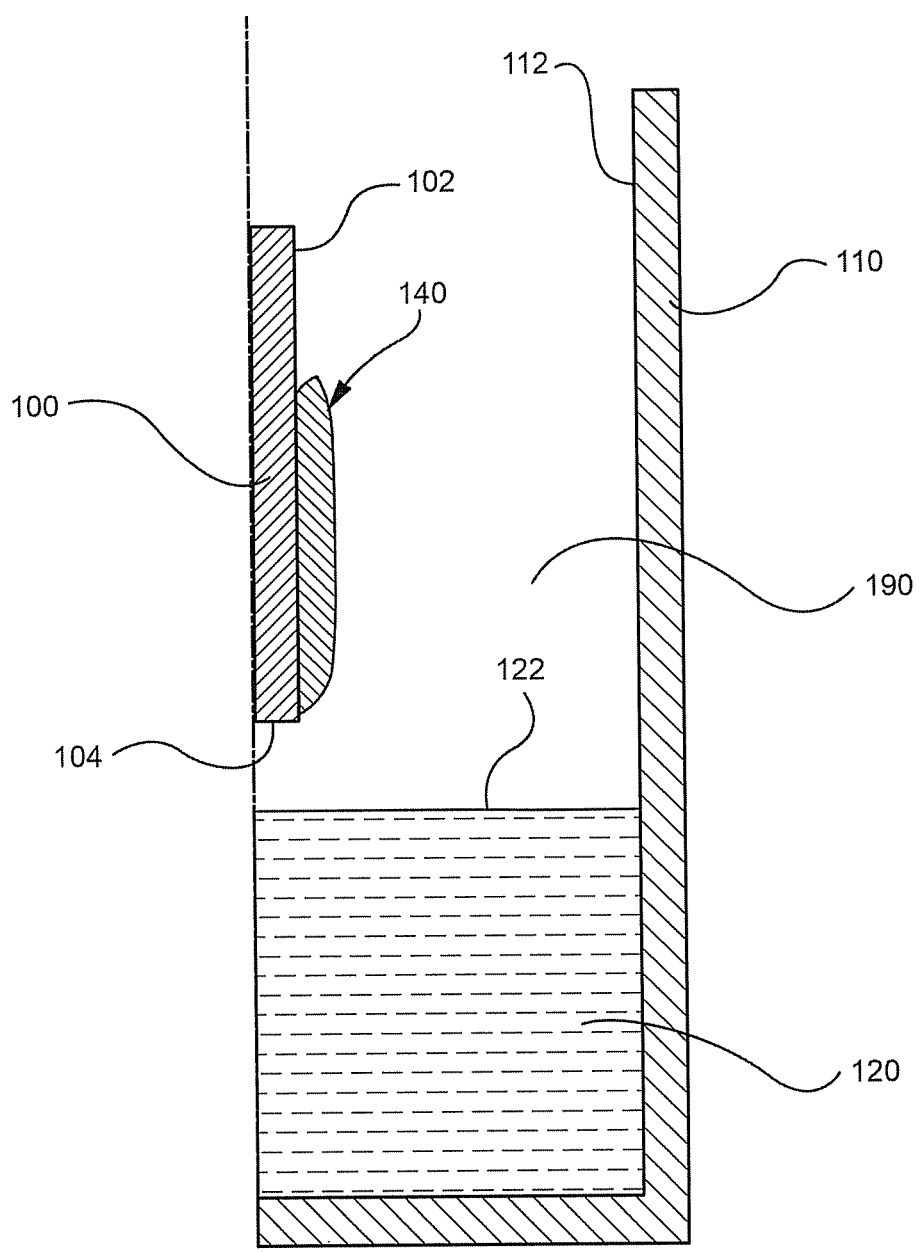

During withdrawal of the mold, because the exposed solid surface is solidified semiconducting material rather than the original mold material, the wetting dynamics between the solid surface and the melt are likely different from those encountered during submersion. Referring to FIG. 1G, in the example of molten silicon solidifying over a silicon solid layer 140, a dynamic, convex meniscus 134 forms at the solid-liquid-gas triple point. As a result of this dynamic meniscus 134, during withdrawal of the mold from the molten semiconducting material 120, an additional solid layer 146 (Stage III solid layer) forms over the previously-formed solid layers (Stage I and Stage II solid layers). The Stage III solid layer 146 is also referred to herein as the overlayer, and determines the minimum thickness of a solid layer obtained through exocasting.

Although the Stage II solid layer 144 that has formed over the Stage I solid layer 142 will continue to grow or remelt according to the local heat flux dynamics beneath the surface 122 of the molten semiconducting material 120, the Stage III solid layer 146 forms above the equilibrium surface 122 of the molten semiconducting material 120 due to the wetting of the solid layer (e.g., exposed surface of the Stage II solid layer 144) by the molten semiconducting material 120. During withdrawal, a Stage III solid layer growth front 136 is continuously fed by molten material from beneath the dynamic meniscus 134.

In embodiments, a majority of the thickness of the solid layer 140 will be formed during Stage II (i.e., growth that is substantially perpendicular to the mold's external surface). Referring to FIGS. 1G-1J, the dynamic meniscus 134, the Stage II solid layer 144 and the Stage III layer 146 formed during withdrawal define a dynamic volume 128 or "dragged volume" of the melt that is located above the equilibrium surface 122 of the molten semiconducting material 120. The dynamic volume 128, which is approaching solidification as a result of the various heat transfer mechanisms, continuously feeds the Stage III solidification front 136 during withdrawal.

In embodiments, the withdrawal rate can be from about 1 to 50 cm/sec, e.g., 2, 5, 10 or 20 cm/sec. Higher withdrawal rates may cause fluid drag that can induce perturbations into the dynamic meniscus, which can be transferred to the Stage III overlayer.

After mold 100 is removed from vessel 110 and sufficiently cooled, the solid layer 140 of semiconducting material may be removed or separated from the mold 100 using, for example, differential expansion and/or mechanical assistance. Alternatively, the solid layer 140 may remain on mold 100 as a supported article of semiconducting material.

Referring again to FIG. 2, because the solid layer thickness versus submersion time curve displays a thickness maximum at the transition time, a solid layer having a particular thickness (i.e., other than the maximum thickness) can be obtained using a submersion time that is less than or greater than the transition time. In the example of FIG. 2, a 200 micron solid layer could be produced using a submersion time of either ~1.2 seconds or ~5 seconds.

It will be appreciated that either submersion time would produce a ~200 micron thick solid layer, but that the respective times offer process trade-offs. A process involving a 1.2 second submersion time can be completed more rapidly than a process involving a 5 second submersion time, which can become increasingly important upon scale-up. On the other hand, because the rate of thickness change (i.e., slope of the thickness versus submersion time curve) at about 1.2 seconds is much greater than the rate of thickness change at about 5 seconds, small fluctuations in the more rapid process will lead to greater variability in solid layer thickness.

Figure 3:
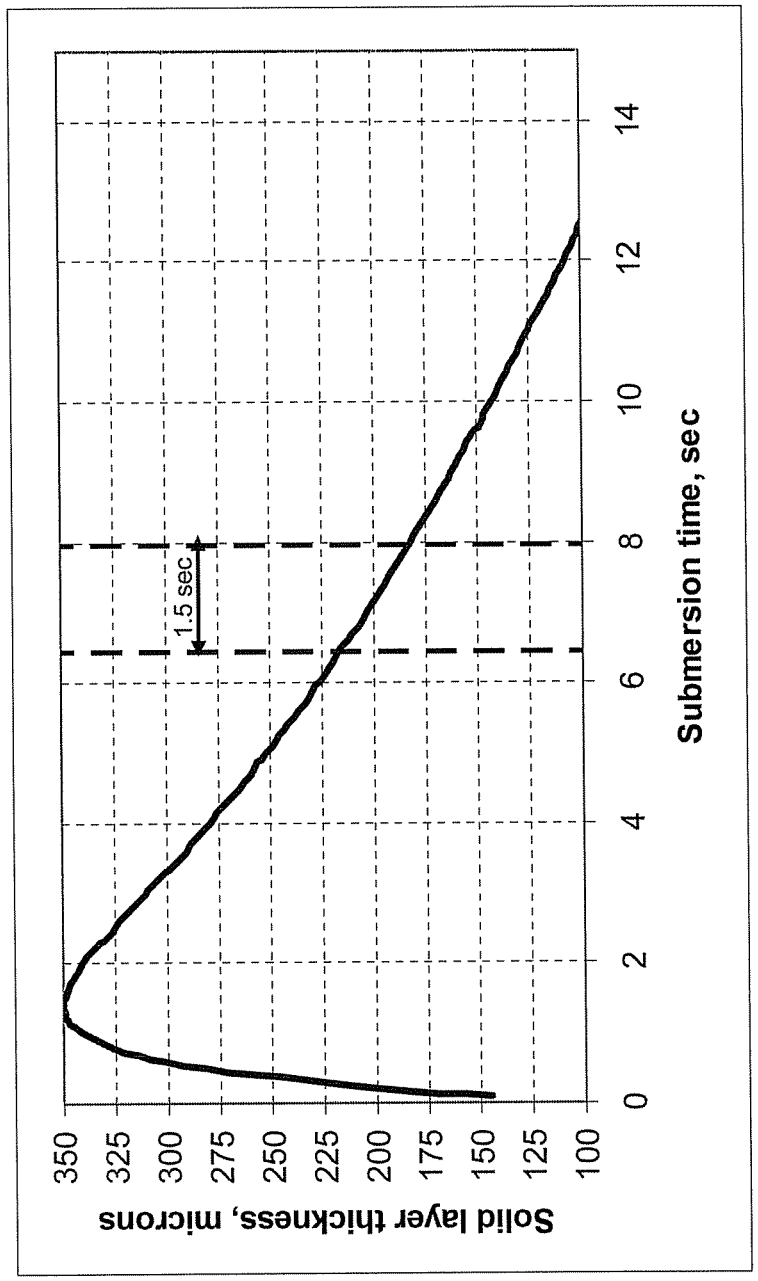
FIG. 3 is a graph of solid layer thickness versus submersion time according to a comparative example.

Due to the local slope in the thickness versus submersion time curve, any variability in submersion time or other process parameters would lead to variability in the solid layer. A comparative exocasting example that illustrates this principle is described with reference to FIG. 3, which is a plot of solid layer thickness versus time for a silicon solid layer formed over a silica mold having dimensions of 15 cm×15 cm×1.5 mm thick, and an initial mold temperature of 100° C.

The target thickness for the solid layer is 200 microns with as low a TTV as possible, e.g., less than 30 microns. As seen with reference to FIG. 3, the transition time is about 1.5 sec, which corresponds to a maximum solid layer thickness of about 350 microns. Submersion times within either the solidification regime (~0.25 sec) or the remelt regime (~7.2 sec) could be selected to solidify a solid layer having the target thickness of 200 microns.

For a mold of these dimensions, a submersion/withdrawal velocity of 20 cm/sec leads to an excess residence time of 1.5 sec between the leading and trailing edges of the mold. With an average submersion time of 7.2 sec, the leading edge of the mold experiences a local submersion time of 7.95 sec, while the trailing edge of the mold experiences a local submersion time of 6.45 sec. This variability in submersion time leads to a local leading edge thickness of 215 microns, a local trailing edge thickness of 182 microns, and a maximum TTV of ~33 microns. The residence time window between the leading and trailing edges is illustrated using the vertical dashed lines in FIG. 3.

Applicants have discovered that minimization of the total thickness variability can be achieved by choosing mold attributes, such as the composition, thickness and initial temperature of a suitable mold such that the maximum thickness in a corresponding thickness versus submersion time curve is equal to the target thickness of the solid layer.

In one embodiment, the target thickness for a silicon solid layer remains 200 microns. In this example, the mold dimensions are 15 cm×15 cm×3 mm thick, and the initial mold temperature is 800° C. As seen with reference to FIG. 4, this combination of mold thickness and initial temperature for a silica mold leads to a condition where the maximum thickness at the transition time (~3.6 sec) is roughly equal to the target thickness of 200 microns, and the local slope of the thickness versus submersion time curve is nearly zero, which reduces the time dependent variability in solid layer thickness.

Figure 4:
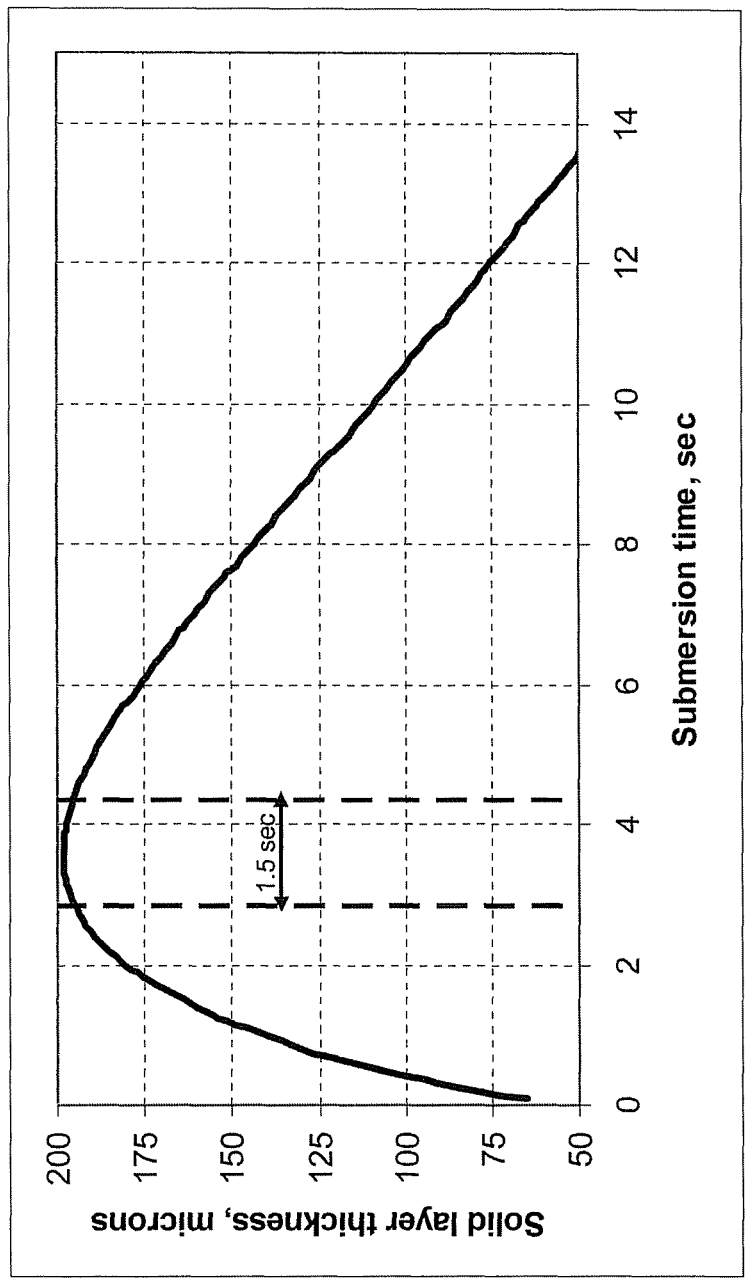
FIG. 4 is a graph of solid layer thickness versus submersion time according to one embodiment.

In the example corresponding to FIG. 4, with an average submersion time of 3.6 sec, the leading edge of the mold experiences a local submersion time of 4.35 sec, a midline of the mold experiences a local submersion time of 3.6 sec, and the trailing edge of the mold experiences a local submersion time of 2.85 sec. This variability in submersion time leads to a local leading edge thickness of 195.5 microns, a local centerline thickness of 198.3 microns, and a local trailing edge thickness of 195.1 microns. The corresponding TTV is 3.2 microns. With relation to the comparative process, the TTV result is reduced by over an order of magnitude.

It will be understood that the shape of the thickness versus submersion time curve, including the value of the transition time and the corresponding value for the maximum solid layer thickness can be manipulated using various combinations of at least the mold material, mold thickness and the initial mold temperature. The choice of mold material can affect, for example, the thermal conductivity, density, and heat capacity of the mold. The effect of the mold thickness and the initial mold temperature on the maximum solid layer thickness and the attendant transition temperature is shown in FIGS. 5 and 6 for a silica mold.

Figure 5:
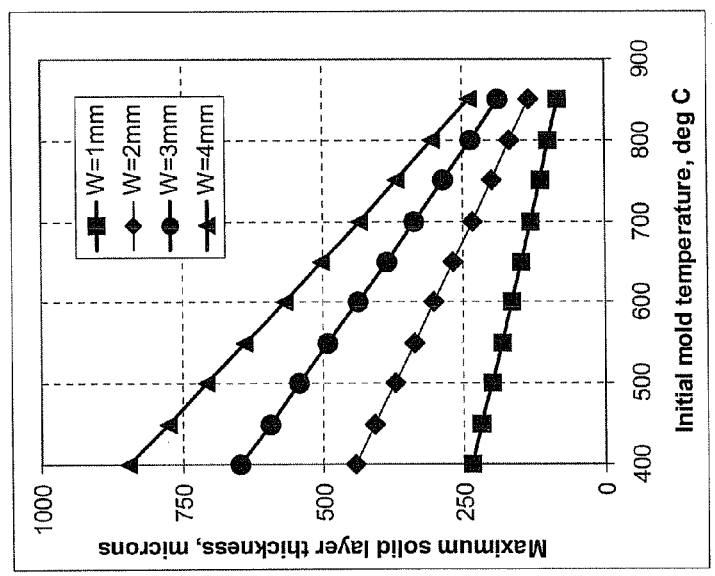
FIG. 5 is a graph of maximum solid layer thickness versus initial mold temperature for different mold dimensions.
Figure 6:
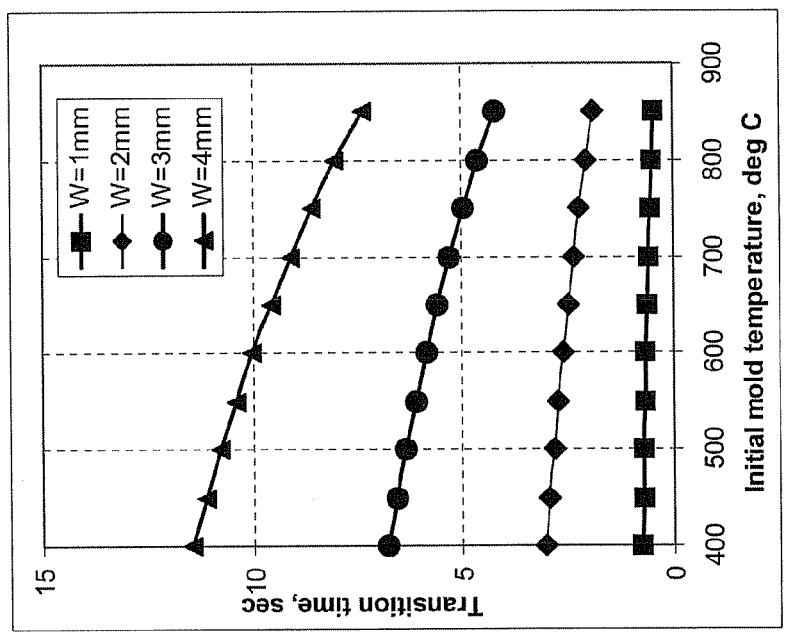
FIG. 6 is a graph of transition time versus initial mold temperature for different mold dimensions.

FIG. 5 is a graph of maximum solid layer thickness versus initial mold temperature for various mold thicknesses, while FIG. 6 is a graph of transition time versus initial mold temperature for various mold thicknesses. In each of FIG. 5 and FIG. 6, the dependence of either maximum solid layer thickness or transition time on initial mold temperature is shown for mold thicknesses of 1, 2, 3 and 4 mm, as indicated in the respective keys. From graphs such as these, which can be developed for molds having a range of thermal properties (e.g., thermal conductivity, density, heat capacity, etc.) a skilled practitioner can determine the appropriate parameter space for a desired low TTV process.

The disclosed methods can be used to produce articles of semiconducting material having one or more desired attributes related to, for example, total thickness, thickness variability, impurity content and/or surface roughness. Such articles, such as, for example, silicon sheets, may be used to for electronic devices such as photovoltaic devices. By way of example, an as-formed silicon sheet may have areal dimensions of about 156 mm×156 mm, a thickness in a range of 100 µm to 400 µm, and a substantial number of grains larger than 1 mm.

In embodiments, a total thickness of the solid layer is 150, 200, 250, 300, 350 or 400 µm. In further embodiments, a total thickness of the solid layer is less than 400 µm (e.g., less than 350, 300, 250, 200 or 150 µm).

One advantage of the disclosed method includes the ability to minimize the total thickness variability (TTV) due to residence time variability over an areal dimension of the solid layer. A further advantage is the ability to minimize the total thickness variability due to fluctuations of process parameters such as mold and melt temperatures.

Total thickness variability means the normalized maximum difference in thickness between the thickest point and the thinnest point within a sampling area of a solid layer. The total thickness variability, TTV, is equal to $(t_{max}-t_{min})/t_{target}$, where $t_{max}$ and $t_{min}$ are the maximum and minimum thicknesses within the sampling area and $t_{target}$ is the target thickness. The sampling area may be defined as the whole or a portion of the solid layer. In an embodiment, the total thickness variability of a solid layer is less than 10% (e.g., less than 5%). In processes involving the formation of more than one solid layer, a thickness dispersion is defined as the standard deviation of the ratio of average solid layer thickness to target thickness.

Unless otherwise indicated, all numbers used in the specification and claims are to be understood as being modified in all instances by the term "about," whether or not so stated. It should also be understood that the precise numerical values used in the specification and claims form additional embodiments. Efforts have been made to ensure the accuracy of the numerical values disclosed herein. Any measured numerical value, however, can inherently contain certain errors resulting from the standard deviation found in its associated measuring technique.

It is noted that, as used in this specification and the appended claims, the singular forms "a," "an," and "the," include plural referents unless expressly and unequivocally limited to one referent, and vice versa. Thus, by way of example only, reference to "a solid layer" can refer to one or more layers, and reference to "a semiconducting material" can refer to one or more semiconducting materials. As used herein, the term "includes" and its grammatical variants are intended to be non-limiting, such that recitation of items in a list is not to the exclusion of other like items that can be substituted or added to the listed items.

It will be apparent to those skilled in the art that various modifications and variation can be made to the programs and methods of the present disclosure without departing from the scope its teachings. Other embodiments of the disclosure will be apparent to those skilled in the art from consideration of the specification and practice of the teachings disclosed herein. It is intended that the embodiments described in the specification be considered as exemplary only.

We claim:

1. A method of making a solid layer of semiconducting material, comprising:
   determining a target thickness for the solid layer;
   selecting a mold having at least one mold attribute such that in a plot of solid layer thickness versus submersion time for submersion of the mold into molten semiconducting material, a maximum in the solid layer thickness, which occurs at a transition time, is substantially equal to the target thickness; and
   submerging the mold into and withdrawing the mold from the molten semiconducting material to form a solid layer of semiconducting material over an external surface of the mold, wherein a submersion time for the mold is substantially equal to the transition time and during the submerging the solid layer begins to remelt into the molten semiconducting material.

2. The method according to claim 1, wherein the at least one mold attribute is selected from mold composition, mold thickness, and initial mold temperature.

3. The method according to claim 1, wherein the mold comprises fused silica, graphite, silicon nitride, single crystal silicon or polycrystalline silicon.

4. The method according to claim 1, wherein a thickness of the mold ranges from about 0.1 to 100 mm.

5. The method according to claim 1, wherein an initial temperature of the mold ranges from about −50° C. to 1400° C.

6. The method according to claim 1, wherein a rate of submersion is from about 1 to 50 cm/sec.

7. The method according to claim 1, wherein a rate of withdrawal is from about 1 to 50 cm/sec.

8. The method according to claim 1, wherein a rate of submersion is substantially equal to a rate of withdrawal.

9. The method according to claim 1, wherein a total thickness variability of the solid layer is less than 10%.

* * * * *